(12) United States Patent
Hsu et al.

(10) Patent No.: US 8,878,052 B2
(45) Date of Patent: Nov. 4, 2014

(54) APPARATUS OF LARGE-SCALED SOLAR CELL MODULE

(71) Applicant: Institute of Nuclear Energy Research, Atomic Energy Council, Executive Yuan, R.O.C., Taoyuan County (TW)

(72) Inventors: Guo-Chun Hsu, Taoyuan County (TW); Hong-Yih Yeh, Taoyuan County (TW); Wen-Fu Chen, New Taipei (TW)

(73) Assignee: Institute of Nuclear Energy Research, Atomic Energy Council, Lungtan, Taoyuan (TW)

( * ) Notice: Subject to any disclaimer, the term of this patent is extended or adjusted under 35 U.S.C. 154(b) by 99 days.

(21) Appl. No.: 13/869,194

(22) Filed: Apr. 24, 2013

(65) Prior Publication Data
US 2014/0076381 A1    Mar. 20, 2014

(30) Foreign Application Priority Data
Sep. 14, 2012    (TW) .............................. 101133576 A

(51) Int. Cl.
| | | |
|---|---|---|
| H01L 31/054 | (2014.01) | |
| H01L 31/052 | (2014.01) | |
| H01L 31/042 | (2014.01) | |
| F24J 2/08 | (2006.01) | |
| F24J 2/46 | (2006.01) | |

(52) U.S. Cl.
CPC .......... *H01L 31/052* (2013.01); *H01L 31/0422* (2013.01); *H01L 31/0524* (2013.01); *F24J 2/08* (2013.01); *F24J 2/464* (2013.01); *Y02E 10/52* (2013.01)
USPC .......................................... 136/251; 136/246

(58) Field of Classification Search
USPC .................................................. 136/251, 246
See application file for complete search history.

(56) References Cited

U.S. PATENT DOCUMENTS

| | | | | | |
|---|---|---|---|---|---|
| 3,016,642 | A | * | 1/1962 | Kowalski | 40/785 |
| 3,150,903 | A | * | 9/1964 | Chapman et al. | 312/265.4 |
| 3,265,416 | A | * | 8/1966 | Downes | 403/264 |
| 3,698,114 | A | * | 10/1972 | Hirsch et al. | 40/782 |
| 4,073,113 | A | * | 2/1978 | Oudot et al. | 52/710 |
| 4,368,584 | A | * | 1/1983 | Logan | 40/785 |
| 4,438,578 | A | * | 3/1984 | Logan | 40/782 |
| 4,516,341 | A | * | 5/1985 | Jenkins | 40/785 |
| 4,718,184 | A | * | 1/1988 | Sherman | 40/785 |
| 4,862,612 | A | * | 9/1989 | Sugihara et al. | 40/782 |
| 4,974,352 | A | * | 12/1990 | Shwu-Jen | 40/783 |
| 5,046,791 | A | * | 9/1991 | Kooiman | 312/265.1 |
| 5,609,402 | A | * | 3/1997 | Kemp | 312/265.4 |
| 6,059,322 | A | * | 5/2000 | Nagai et al. | 285/125.1 |
| 6,331,092 | B1 | * | 12/2001 | Linger | 403/382 |
| 6,467,635 | B1 | * | 10/2002 | McComb et al. | 211/85.16 |
| 6,481,177 | B1 | * | 11/2002 | Wood | 52/656.9 |
| 7,726,301 | B2 | * | 6/2010 | Shin et al. | 126/704 |
| 7,735,484 | B2 | * | 6/2010 | Shin et al. | 126/704 |
| 8,356,446 | B2 | * | 1/2013 | Takeda et al. | 52/79.12 |
| 8,474,213 | B2 | * | 7/2013 | Oetlinger | 52/655.1 |
| 2004/0036389 | A1 | * | 2/2004 | Tsai | 312/265.4 |
| 2006/0215396 | A1 | * | 9/2006 | Shin et al. | 362/153 |
| 2007/0095385 | A1 | * | 5/2007 | Shin et al. | 136/246 |
| 2008/0302356 | A1 | * | 12/2008 | Shin et al. | 126/704 |

(Continued)

*Primary Examiner* — Golam Mowla
(74) *Attorney, Agent, or Firm* — Jackson IPG PLLC

(57) ABSTRACT

An apparatus of solar cell module is provided. The apparatus is large-scaled. A supporting frame is combined with solar cell modules. Thus, the present invention can be easily installed; material cost is saved; and the cost spent on adjusting levelness of the solar cell modules can be reduced.

9 Claims, 4 Drawing Sheets

(56) References Cited

U.S. PATENT DOCUMENTS

| | | | |
|---|---|---|---|
| 2009/0320923 A1* | 12/2009 | Shin et al. | 136/259 |
| 2010/0102011 A1* | 4/2010 | Blum | 211/8 |
| 2010/0218804 A1* | 9/2010 | Shin et al. | 136/246 |
| 2011/0005330 A1* | 1/2011 | Huang et al. | 73/825 |
| 2011/0005574 A1* | 1/2011 | Shin | 136/246 |
| 2014/0048497 A1* | 2/2014 | Hong et al. | 211/41.1 |

* cited by examiner

APPARATUS OF LARGE-SCALED SOLAR CELL MODULE

TECHNICAL FIELD OF THE INVENTION

The present invention relates to solar cell module; more particularly, relates to combining a supporting frame and a plurality of solar cell modules into a whole one to effectively reduce complexity and cost of installation and to further save human labor on adjusting levelness of solar cell modules.

DESCRIPTION OF THE RELATED ARTS

A high-condensing solar power system has a higher efficiency on generating power than a general solar cell; yet, a solar tracking apparatus is necessary. A large-scaled system of solar cell module is an important element in the tracking apparatus, which provides a high-strength and high-accuracy platform to be installed with solar cell modules for receiving solar energy.

Regarding small-scaled system of solar cell module, a supporting unit is necessary to be used as a platform for installing the system on a horizontal turning beam of the tracking apparatus, while the solar cell modules are installed one by one. Furthermore, on installing the solar cell modules, each solar cell module has to be adjusted to make the whole solar cell modules have a good levelness. As a result, both complexity and cost of installation are big and much human labor has to be spent on adjusting levelness of solar cell modules.

Hence, the prior arts do not fulfill all users' requests on actual use.

SUMMARY OF THE INVENTION

The main purpose of the present invention is to combine a supporting frame and a plurality of solar cell modules into a whole one to effectively reduce complexity and cost of installation and to further save human labor on adjusting levelness of solar cell modules.

To achieve the above purpose, the present invention is an apparatus of large-scaled solar cell module, comprising a supporting frame, a plurality of hanging devices, a plurality of solar cell modules and a plurality of condensing devices, where the supporting frame comprises a plurality of vertical plates, two horizontal plates, a plurality of first and second bearing plates, a plurality of first and second connecting plates and a plurality of corner plates; where the two horizontal plates are set at two ends of the vertical plates separately; where the upper and the lower bearing plates are set at corresponding upper and lower inner sides of the vertical plates respectively; where the upper and the lower connecting plates connects the vertical plates separately; where the corner plates are set at outermost corner between the vertical plates and the horizontal plates; where the hanging devices are set on upper surfaces of the outermost vertical plates; where the solar cell modules are combined on the lower bearing plates and the lower connecting plates; and where the condensing devices are combined on the upper bearing plates and the upper connecting plates. Accordingly, a novel apparatus of large-scaled solar cell module is obtained.

BRIEF DESCRIPTIONS OF THE DRAWINGS

The present invention will be better understood from the following detailed description of the preferred embodiment according to the present invention, taken in conjunction with the accompanying drawings, in which FIG. 1 is the perspective view showing the preferred embodiment according to the present invention;

DESCRIPTION OF THE PREFERRED EMBODIMENT

The following description of the preferred embodiment is provided to understand the features and the structures of the present invention.

Figure 1:
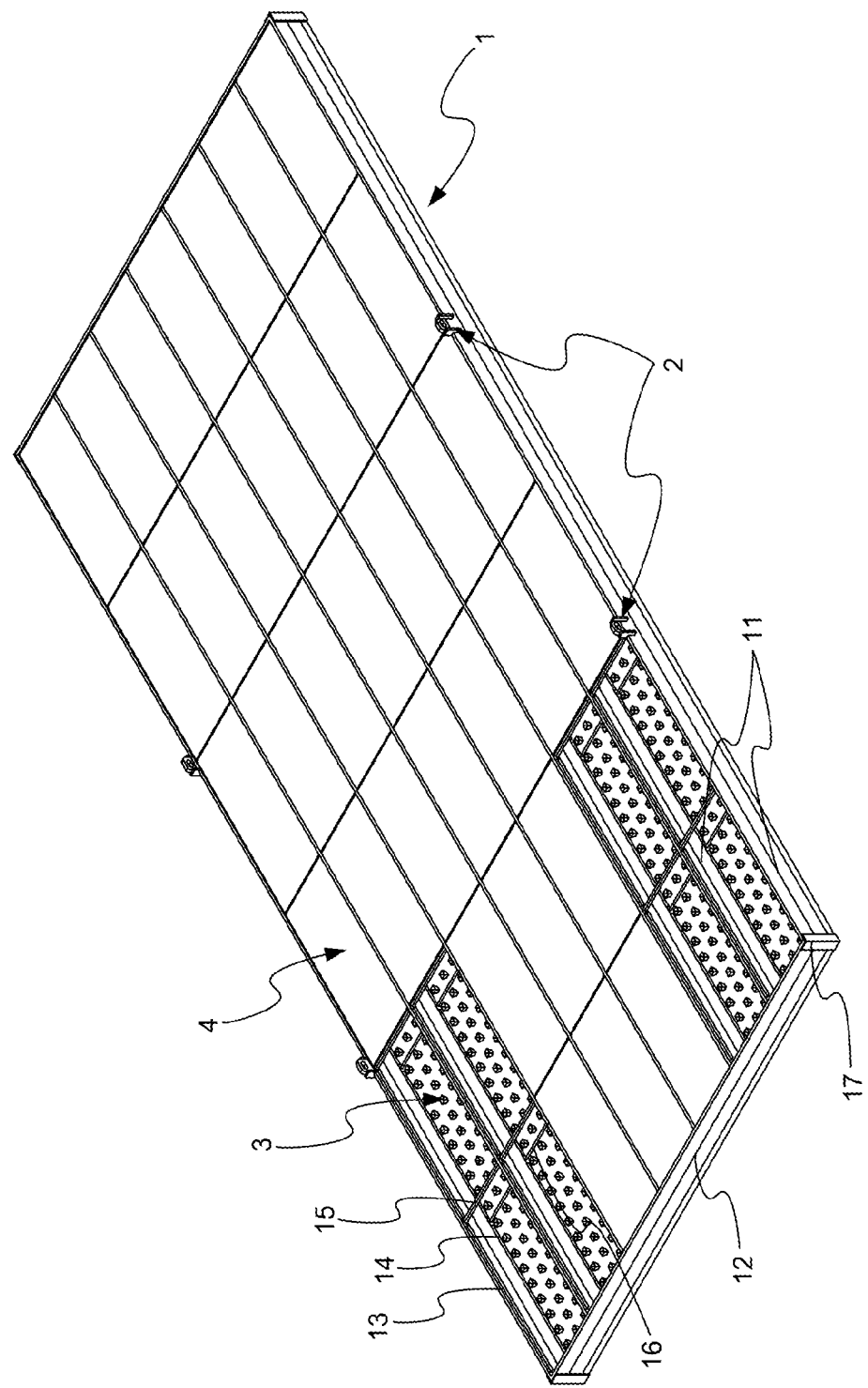
Figure 2:
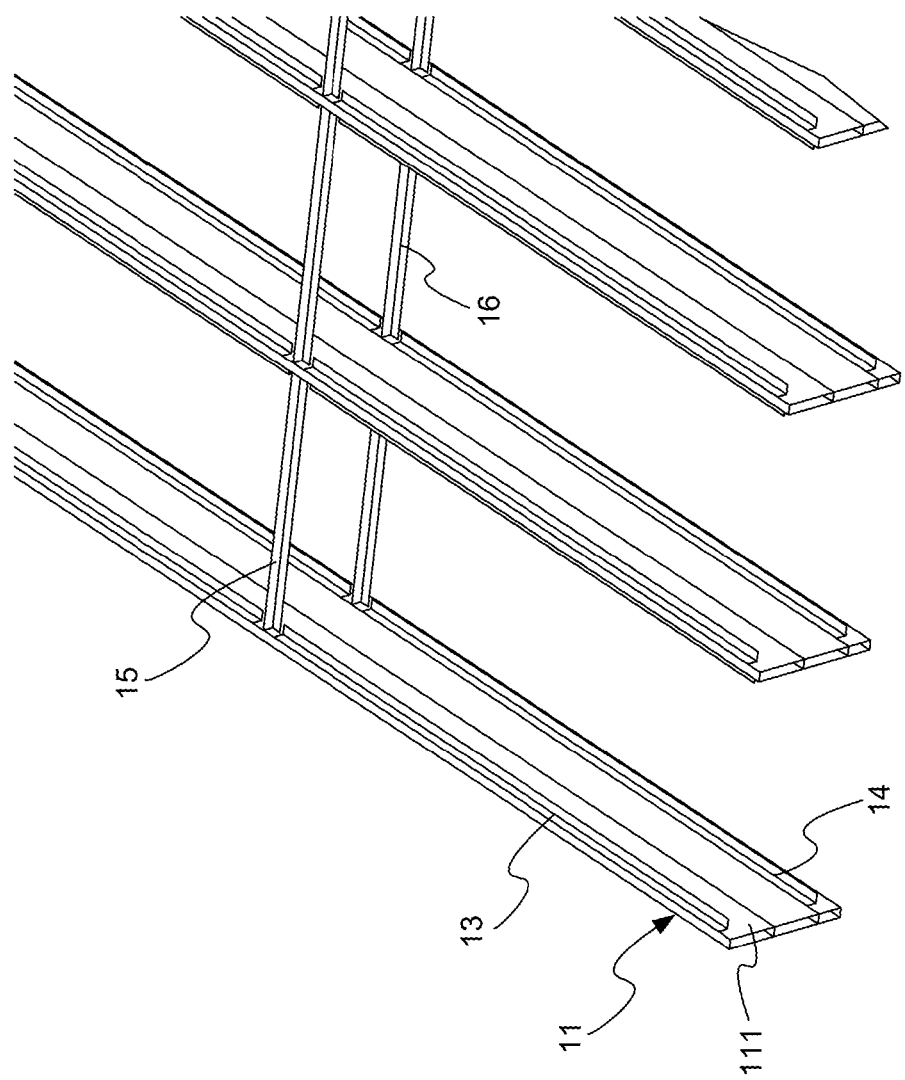
FIG. 2 is the view showing the binding of the vertical plates, the bearing plates and the connecting plates.
Figure 3:
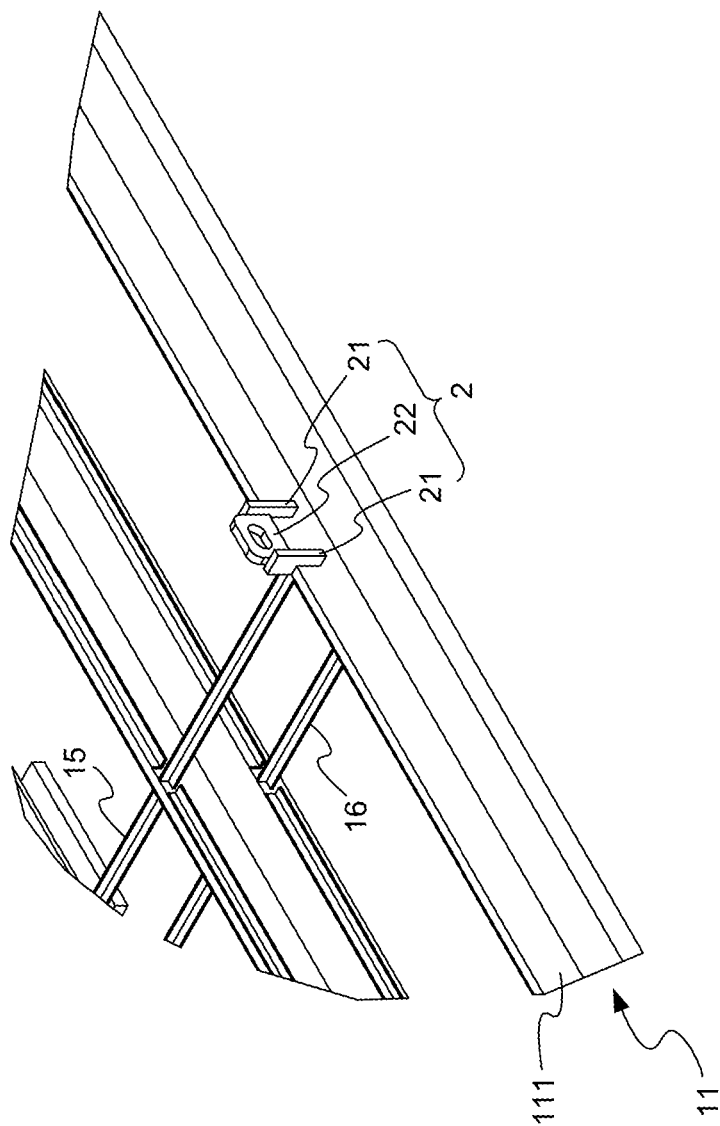
FIG. 3 is the view showing the binding of the hanging devices and the vertical plates.
Figure 4:
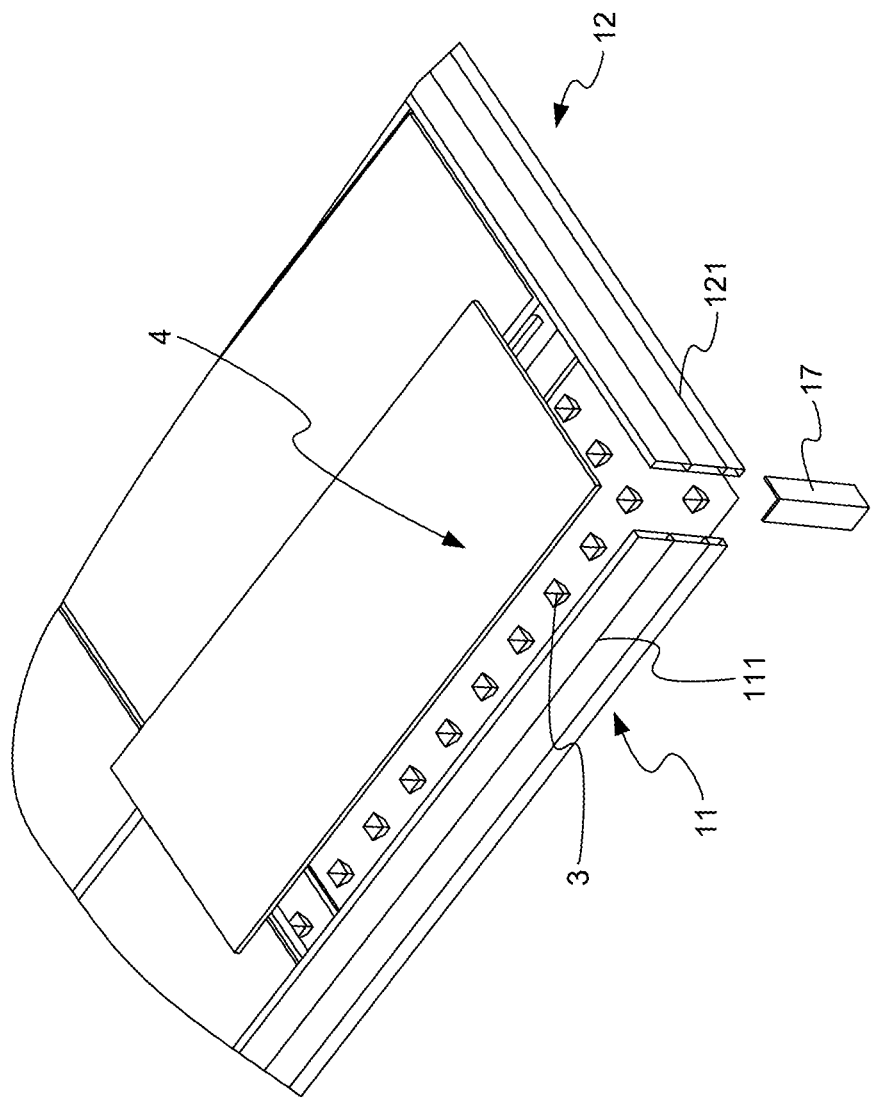
FIG. 4 is the view showing the binding of the corner plates, the solar cell modules and the condensing devices.

Please refer to FIG. 1 to FIG. 4, which are a perspective view showing a preferred embodiment according to the present invention; and views showing a binding of vertical plates, bearing plates and connecting plates, a binding of hanging devices and vertical plates, and a binding of corner plates, solar cell modules and condensing devices. As shown in the figures, the present invention is an apparatus of large-scaled solar cell module, comprising a supporting frame 1, a plurality of hanging devices 2, a plurality of solar cell modules 3 and a plurality of condensing devices 4.

The supporting frame 1 comprises a plurality of vertical plates 11; two horizontal plates 12 at two ends of the vertical plates 11 separately; a plurality of upper and lower bearing plates 13,14 at corresponding upper and lower sides of the vertical plates 11 respectively; a plurality of upper and lower connecting plates 15,16 connecting the vertical plates 11 separately; and a plurality of corner plates 17, at outermost corner between the vertical plates 11 and the horizontal plates 12. Therein, every vertical plate 11 comprises three first square pipes 111; the first square pipes 111 are combined through riveting or welding; every horizontal plates 12 comprises three second square pipes 121; and, the second square pipes 121 are combined through riveting or welding.

The hanging devices 2 are set on upper surfaces of the outermost vertical plates 11; and every hanging device 2 comprises two corresponding columns 21 and a ring 22 between the columns 21.

Every solar cell module 3 is combined on the lower bearing plate 14 and the lower connecting plate 16.

Every condensing device 4 is combined on the upper bearing plate 13 and the upper connecting plate 15.

Thus, a novel apparatus of large-scaled solar cell module is obtained.

On using the present invention, the eight vertical plates 11 are arranged with equal intervals in between. The five upper and lower connecting plates 15,16 are correspondingly arranged with equal intervals in between along the vertical plates 11 separately. The upper and lower connecting plates 15,16 are combined with the vertical plates 11 through riveting or welding. The upper and lower bearing plates 13,14 are combined with the vertical plates 11 at corresponding upper and lower inner sides through riveting or welding respectively. The two horizontal plates 12 are combined with the vertical plates 11 separately at two ends through riveting or welding. The corner plates 17 are combined with the vertical plates 11 and the horizontal plates 12 at outermost corner between the vertical plates 11 and the horizontal plates 12 to form a supporting frame 1. The hanging devices 2 are combined with the outermost vertical plates 11 on upper surfaces through welding. The solar cell modules 3 are combined on the lower bearing plates 14 and the lower connecting plates 16. The condensing devices 4 are combined on the upper bearing plates 13 and the upper connecting plates 15. By using the hanging devices 2, the present invention is installed on a solar tracking frame for generating biggest power by keeping focusing on the sun. Thus, the present invention combines the supporting frame 1 and the solar cell modules 3 into a whole one to effectively reduce complexity and cost of installation and to further save human labor on adjusting levelness of solar cell modules.

To sum up, the present invention is an apparatus of large-scaled solar cell module, where a supporting frame and a plurality of solar cell modules are combined into a whole one to effectively reduce complexity and cost of installation and to further save human labor on adjusting levelness of solar cell modules.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. An apparatus of large-scaled solar cell module, comprising
    a supporting frame, said supporting frame comprising
        a plurality of first-directional plates;
        two second-directional plates;
        a plurality of first bearing plates;
        a plurality of second bearing plates;
        a plurality of first connecting plates;
        a plurality of second connecting plates; and
        a plurality of corner plates,
        wherein said second-directional plate is perpendicular to said first-directional plate;
        wherein said two second-directional plates are located at two ends of said first-directional plates separately;
        wherein said first and said second bearing plates are located at two corresponding inner sides of said first-directional plates separately;
        wherein said first and said second connecting plates connects said first-directional plates at two sides separately; and
        wherein said corner plates are located at outermost corner between said first-directional plates and said second-directional plates;
    a plurality of hanging devices, said hanging devices being located on end surfaces at a side of outermost ones of said first-directional plates;
    a plurality of solar cell modules, said solar cell modules being combined on said second bearing plates and said second connecting plates; and
    a plurality of condensing devices, said condensing devices being combined on said first bearing plates and said first connecting plates.

2. The apparatus according to claim 1,
wherein said first-directional plate comprises three first square pipes and said first square pipes are combined through a process selected from a group consisting of riveting and welding.

3. The apparatus according to claim 1,
wherein said second-directional plate comprises three second square pipes and said second square pipes are combined through a process selected from a group consisting of riveting and welding.

4. The apparatus according to claim 1,
wherein said two second-directional plates are combined to said first-directional plates at two ends of said first-directional plates through a process selected from a group consisting of riveting and welding.

5. The apparatus according to claim 1,
wherein said bearing plates are combined to said first-directional plates through a process selected from a group consisting of riveting and welding.

6. The apparatus according to claim 1,
wherein said connecting plates are combined to said first-directional plates through a process selected from a group consisting of riveting and welding.

7. The apparatus according to claim 1,
wherein said corner plates are combined to said first-directional plates and said second-directional plates at said outermost corner between said first-directional plates and said second-directional plates through a process selected from a group consisting of riveting and welding.

8. The apparatus according to claim 1,
wherein said hanging device comprises two corresponding columns and a ring between said columns.

9. The apparatus according to claim 1,
wherein said hanging devices are combined to said first-directional plates through welding.

* * * * *